(12) United States Patent
Gutsche

(10) Patent No.: US 6,437,387 B2
(45) Date of Patent: Aug. 20, 2002

(54) MEMORY CELL WITH A STACKED CAPACITOR

(75) Inventor: Martin Gutsche, Neufahrn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/774,743

(22) Filed: Jan. 31, 2001

Related U.S. Application Data

(62) Division of application No. 09/162,867, filed on Sep. 29, 1998, now Pat. No. 6,207,524.

(51) Int. Cl.[7] .................... H01L 27/108; H01L 29/76; H01L 29/94; H01L 31/119

(52) U.S. Cl. ........................................ 257/301; 257/309

(58) Field of Search ................................. 257/301, 302, 257/306, 307, 308, 309, 310, 311

(56) References Cited

U.S. PATENT DOCUMENTS

| | | | | |
|---|---|---|---|---|
| 5,926,709 A | * | 7/1999 | Asiou et al. | 438/253 |
| 6,077,755 A | * | 6/2000 | Green | 438/396 |

* cited by examiner

Primary Examiner—Hoai Ho
Assistant Examiner—Phuc T. Dang
(74) Attorney, Agent, or Firm—Stanton Braden

(57) ABSTRACT

A semiconductor memory cell includes a field effect transistor coupled to a storage capacitor that formed as a multilayer stack over the surface of the silicon chip of the cell. The capacitor is formed by three conformal layers over the surface of a cup-shaped contact hole in a silicon oxide layer overlying the surface of the chip.

6 Claims, 4 Drawing Sheets

MEMORY CELL WITH A STACKED CAPACITOR

This is a divisional, of application Ser. No. 09/162,867 filed Sep. 29 1998, now U.S. Pat. No. 6,207,524.

FIELD OF THE INVENTION

This invention relates to a dynamic random access memory, and more particularly, to a memory cell that uses a stacked capacitor, for use in such a memory and to a method for making the stacked capacitor.

BACKGROUND OF THE INVENTION

A standard dynamic random access memory (DRAM) employs, as the memory cell that is formed in a large array in a silicon chip, a series combination of a switch, generally a MOSFET, and a storage capacitor in which a binary digit (bit) is stored as information for later recovery. In one form of DRAM, the storage capacitor is formed by a stack of layers over the top surface of the silicon chip with the MOSFET switch formed within a region near the top surface of the chip. A conductive plug typically provides a low resistance connection between a source/drain region of the MOSFET in the chip and the layer of the stack that serves as the lower plate (bottom electrode) of the storage capacitor.

To achieve high capacity in DRAMS it is important to make the cells small and to position them closely. It is accordingly important that the stacked capacitor in a DRAM use little surface space on the surface of the chip but still provide a sufficiently high capacitance to serve reliability as the storage node.

SUMMARY OF THE INVENTION

The present invention is a DRAM that comprises an improved stacked capacitor and a process for the manufacture of such a DRAM. As is known, generally the manufacture is largely done on a wafer scale and eventually the wafer is diced into a chip that will house one or more DRAMS. It will be convenient to discuss the processing primarily with respect to a portion of a chip that will house a single memory cell.

The essential elements of the improved capacitor for a memory cell are formed by first forming a contact hole in the dielectric layer that overlies the top surface of a portion of the silicon chip that houses a switching transistor. A contact hole is formed for each capacitor over the region of the switching transistor where the capacitor is to be connected. A conductive plug, typically of doped polysilicon, is then provided at a bottom portion of the contact hole to make a low resistance connection to such region of the transistor, such region corresponding to the storage node of the cell. Typically this is done by first filling the contact hole with a conductor and then removing the top portion of the fill. This leaves only a bottom plug portion. The empty top portion of the contact hole is then widened by etching. The wall of the widened trench is now coated with a layer of a conductor, advantageously platinum, to form a low resistance connection between the coating and the conductive plug. This conductive layer serves as the lower plate (bottom electrode) of the capacitor. When the conductive plug is of a material that needs to be prevented from diffusing into the conductor serving as the lower plate of the capacitor, as is the case with platinum, there should be interposed between the plug and the lower plate a layer of a material that will serve as a barrier to such diffusion. After the deposition of the conductive layer, the diffusion barrier and conductive layer are patterned to localize each in the interior of the widened trench for proper isolation. The conductive layer is then coated with a material of dielectric constant suitable for use as the capacitor dielectric. A layer of barium strontium titanate is presently preferred because its very high dielectric constant makes for an efficient capacitor dielectric. The dielectric layer in turn is coated with a conductive layer, also advantageously of platinum. This platinum layer serves as the upper plate (top electrode) of the capacitor. Of course, measures need be taken to avoid electric shorts between the top and bottom electrodes of the capacitor.

An advantage of this capacitor design is that the storage trench is essentially self-aligned so that its fabrication can be done with a reduced number of lithography steps. Another advantage of this capacitor is that it can readily be made with relatively thin layers of platinum as compared to the layers used in prior design. Platinum is advantageous because of both its favorable work function and its resistance to oxidation.

It is important that individual storage cells be isolated. Accordingly, it is important that the first layer and any diffusion barrier layer be patterned to avoid shorts as discussed above. However, the dielectric layer that serves as the capacitor dielectric and the conductive layer that serves as the upper plate of the capacitor can be extended over the chip to serve in the same roles in other cells of the memory cell array.

Viewed from one process aspect, the present invention is directed to a method for forming a memory cell including a transistor and a capacitor. The method comprises the steps of: forming in a semiconductor chip a transistor having first and second regions of one conductivity-type spaced apart by a region of the opposite conductivity-type along a top surface of said chip; forming a dielectric layer over a top surface of the chip; forming a contact hole with substantially vertical side walls in the dielectric layer by anisotropic etching for exposing a top surface portion of said second region of the transistor; filling the contact hole with a conductive fill for providing a low resistance connection to said second region; removing the top portion of the conductive fill of the contact hole for forming a recess in the conductive fill and exposing the dielectric layer in the contact hole; etching the exposed dielectric layer isotropically for widening the recess and enlarging the surface area of the contact hole in the dielectric layer; depositing a first conductive layer conformally over the enlarged surface area of the contact hole suitable for use as a lower plate of a storage capacitor; patterning this conductive layer for confining it essentially to the interior of the contact hole, depositing a layer of a material of high dielectric constant for covering the first conductive layer; and depositing a second conductive layer conformally over the last mentioned dielectric layer suitable for use as an upper plate of a capacitor that comprises electrically isolated upper and lower plates separated by the layer of high dielectric constant.

Viewed from an other process aspect, the present invention is directed to a method of forming a stacked capacitor on the top surface of a silicon wafer for use as a storage capacitor in series with a switching transistor formed in a top surface portion of the silicon wafer. The method comprises the steps of: forming a first dielectric layer over the top surface of the silicon wafer; forming a contact hole in the dielectric coating for exposing the portion of the silicon transistor to which the lower plate of the storage capacitor is to be electrically connected; partially filling the contact hole with doped polysilicon suitable for forming an electrical connection to said portion of the silicon transistor; widening the unfilled portion of the contact hole to a cup-shape for enlarging the surface area of the unfilled portion; forming a diffusion barrier conductive layer over the doped polysilicon; depositing conformally over the surface of the unfilled portion of the contact hole, a first conductive layer suitable for serving as said lower plate of the capacitor; ion etching to remove any conductive material from the top surface of the first dielectric layer in order to fully separate and isolate individual storage cell trenches; depositing conformally over the first conductive layer and the contact hole a second dielectric layer suitable for serving as the dielectric of the capacitor; and depositing conformally over the second dielectric layer a second conductive layer suitable for serving as the upper plate of the capacitor without providing an electrical short to the lower plate of the capacitor.

Viewed from an apparatus aspect, the present invention is directed to a memory cell for use in a dynamic random access memory. The memory cell comprises a silicon chip whose active area is of one conductivity type and along whose top surface are spaced regions of the opposite conductivity type; and a dielectric coating over said top surface including a cup-shaped contact hole, the cup-shaped contact hole including a bottom plug portion making a low resistance connection to one of the spaced regions, and overlying the cup-shaped walls of the contact hole a conformal lower conductive layer, an intermediate dielectric layer, and an upper conductive layer, said lower and upper conductive layers being electrically isolated by said intermediate dielectric layer and forming a storage capacitor for the memory cell.

A more detailed description of the process and the resulting capacitor will be described with reference to the accompanying drawing.

It is to be noted the drawings are not to scale.

DETAILED DESCRIPTION

Figure 1:
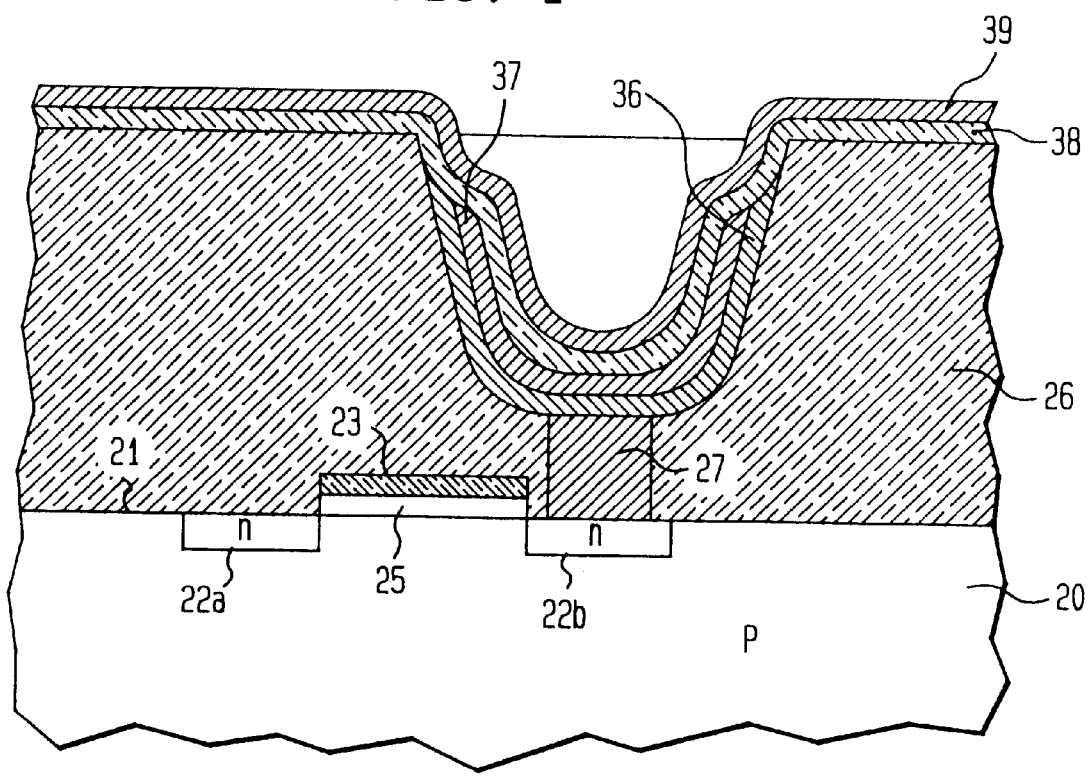
FIG. 1 shows a cross section of a memory cell in accordance with the present invention; and Each of FIGS. 2–6 illustrate a portion of the silicon chip in a different stage in the formation of a stacked capacitor that is characteristic of a memory cell in accordance with the present invention.

FIG. 1 shows in cross section a portion of a silicon chip 20 that includes a memory cell including a stacked capacitor in accordance with the present invention. The silicon chip 20, whose bulk is for example, of p-type resistivity, includes at a top surface 21 thereof spaced first and second regions 22a and 22b, respectively of n-type conductivity to form an n-channel MOSFET. The two regions serve as the current terminals of the switch and operate as the source and drain of the MOSFET. It will be convenient hereinafter to describe region 22a as the source and region 22b as the drain, although, as is known, their roles reverse as logic information is written into or read out of a memory cell. A gate electrode 23 overlies the p-type region between the spaced type regions 22a and 22b and is separated from the surface by the gate oxide 25 in the manner characteristic of a MOSFET. Overlying the top surface 21 is a dielectric coating 26 typically largely of silicon oxide, that eventually includes the bit and word line conductors (not shown) necessary to provide the connections to the cell for writing into and reading out of a bit stored in the cell, in the usual manner. To provide storage the storage capacitor needs to be connected in series with the transistor region that is to serve as the storage node, the second (drain) region 22b. To this end, the capacitor includes a conductive plug 27 that makes low resistance connection to the second region 22b, a first essentially cup-shaped conductive layer 37 that serves as the first (lower) plate of the capacitor, an overlying dielectric layer 38 that covers the first conductive layer 37 and extends over the dielectric coating 26, thereby isolating the first conductive layer 37, and a conformal second conductive layer 39 that overlies the dielectric layer 38 and serves as the upper or second plate of the capacitor. This second conductive layer 39 is generally connected to one terminal of the power supply, typically ground. Generally the first conductive region 22a is connected to the bit line and the gate electrode 23 to the word line of the DRAM.

Although not an essential part of the capacitor, as previously mentioned, when platinum and polysilicon are used, it is generally advantageous to include below the first platinum layer 37, a diffusion barrier conductive layer 36 (See. FIG. 1), as of a material such as TiN, TaSiN, or TiAlN, either conformally over the entire surface of the opening as shown or selectively only over the polysilicon plug. This layer improves wetting of the platinum and also serves to minimize any interdiffusion or interaction between plug 27 and platinum layer and prevents the formation of high resistance interfacial layers during high-temperature processing steps (such as the deposition of the high dielectric material).

In the subsequent figures to be used in describing the fabrication of the capacitor, there is shown only portion 22b of the silicon wafer 20 and the dielectric constant coating 26.

Figure 2:
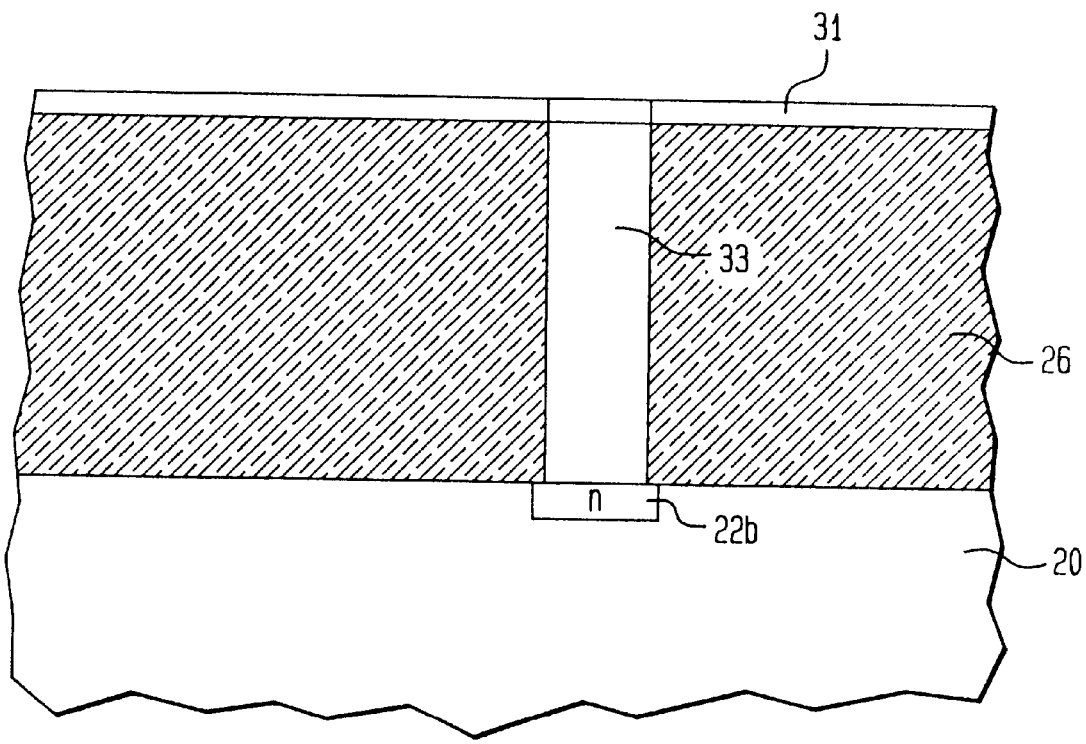

In the fabrication of the capacitor, there is first formed over the dielectric coating 26 a layer of photoresist 31 that is patterned to serve as an etch mask for forming a contact hole in the coating 26 to expose the surface of region 22b of the switching transistor. Advantageously, the etching is anisotropic reactive ion etching (RIE) to form a relatively narrow vertical hole 33 with straight vertical side walls, as seen in FIG. 2 to use only a limited portion of the chip surface.

Figure 3:
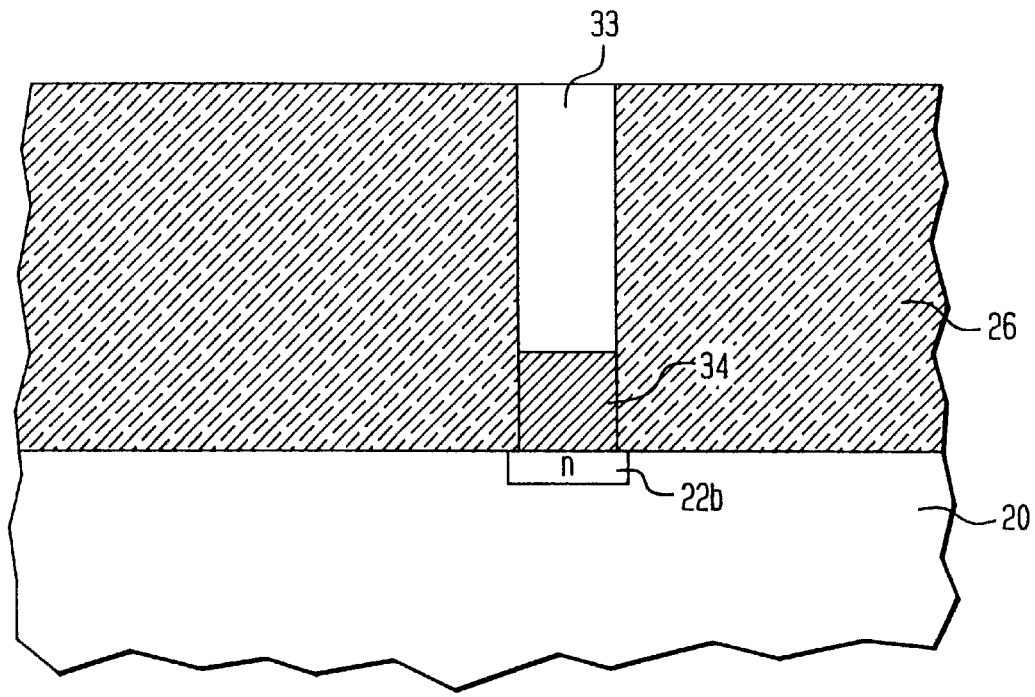

After the photoresist is removed and there has been appropriate cleaning of the surface 21 of the chip 20, the contact hole is partially filled with a conductor, typically polysilicon, to form a plug 34 that makes a low resistance connection to the region 22b as seen in FIG. 3. The height of the plug preferably should be sufficient that the capacitor can be largely formed enough above the surface to little interfere with other conductors in the dielectric layer.

To form the plug 34, it is generally the practice to overfill the contact hole, and if required to use chemical mechanical polishing (CMP) to planarize the surface, and then form a recess 33 in the polysilicon fill by suitable etching, typically isotropic dry etching, to reach the result shown in FIG. 3.

Figure 4:
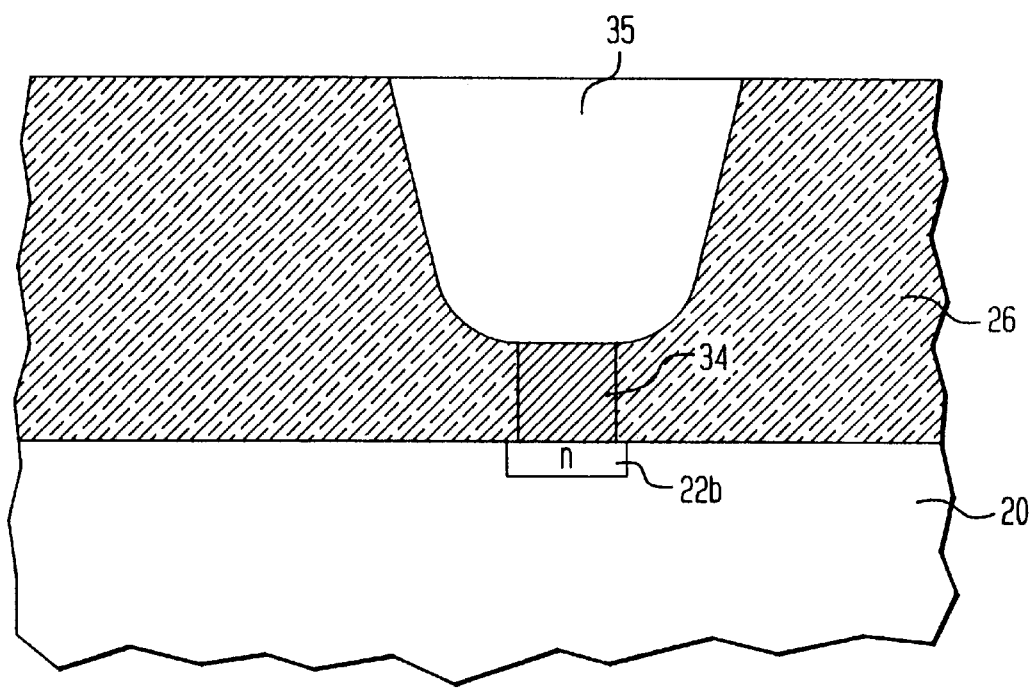

Next, isotropic etching, typically by suitable wet chemistry or chemical downstream etching, is employed to widen the recess or contact hole 33 to the essentially cup shaped opening 35, as shown in FIG. 4. As used herein, essentially cup-shaped is intended to include a substantially cylindrical shape. If desired, and extra step may be added to bring the top surface of the poly plug 34 to the same level as the bottom of the widened trench.

Figure 5:
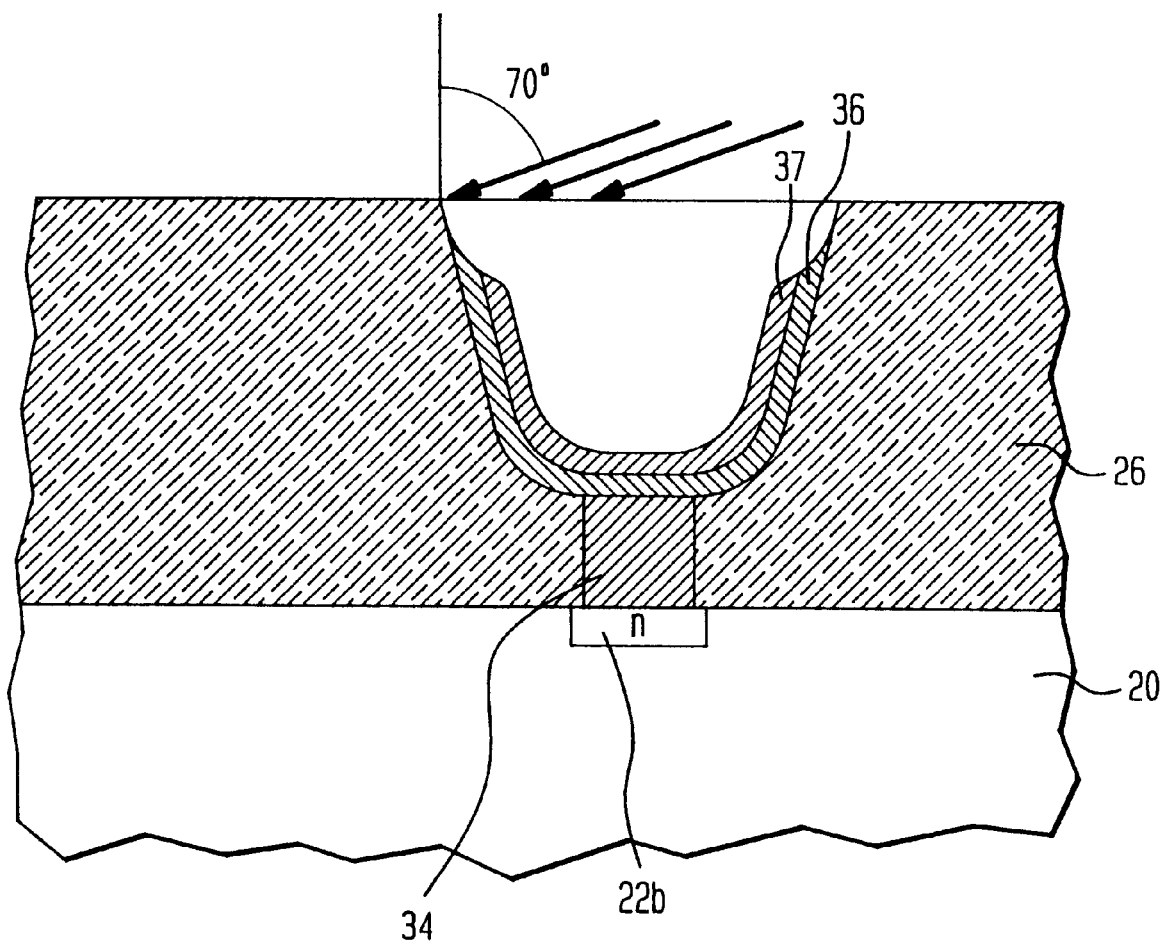

As is shown in FIG. 5, a conductive barrier layer 36 is formed over opening 35 and then there is deposited conformally over the cup-shaped surface of the contact hole a metallic layer 37 suitable for use as the first plate of the capacitor. After the deposition, this metallic layer 37 and the barrier layer 36 are cleaned off where it is not desired, such as the top surface of dielectric coating 26, to confine the layer to the interior of the contact hole. Typically the cleaning is done by a choice of ion-beam etching (IBE), chemically assisted IBE, or reactive IBE. Advantageously, such etching is done with the ions making a glancing angle with the top surface of the dielectric coating 26 to limit exposure of the side walls and bottom of the contact hole to the ion-beam, as is shown in FIG. 5. An angle of incidence of about 70° of the beam with respect to the surface normal of the wafer insures that there is insignificant etching of the capacitor plate material or barrier layer in the contact hole.

As previously discussed, it is advantageous to include the conductive barrier layer 36, either over only the top of the plug or over the entire open surface as shown, before depositing the first layer 37 that serves as the lower plate of the capacitor.

Next, there is deposited conformally over the metal layer 37 a layer 38 of a material suitable for the capacitor dielectric, preferably barium strontium titanate because of its favorably high dielectric constant. Similar high dielectric constant materials should also be feasible.

Figure 6:
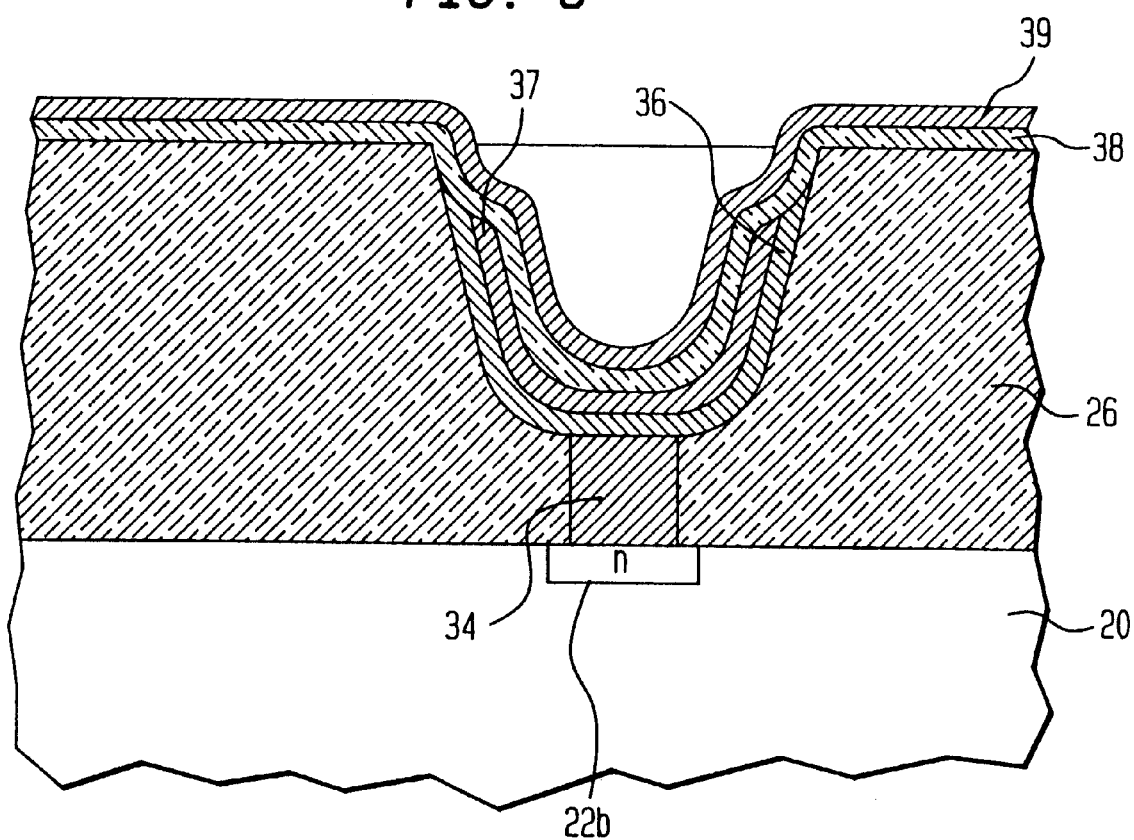

To complete the capacitor and arrive at the structure of FIG. 6, a metal, again preferably platinum, is conformally deposited over the dielectric covered surface of the trench to form a layer 39 that serves as the second (upper) plate of the capacitor. The cup-shaped capacitor of the present invention is shown in FIG. 6.

Typical dimensions of the capacitor are as follows: The width of the hole is between 100 and 500 nanometers and the ratio of the depth to the width is typically between 2 and 3, although it may be chosen in a range between 0.5 and 5.0, largely depending on the space available.

Moreover as mentioned earlier, the dielectric layer 38 and the outer metal layer 39 can each be a continuous layer to serve as the capacitor dielectric and outer electrode of all the storage capacitors of a certain array.

It is to be understood that the exemplary memory cell described is merely illustrative of the general principles of the invention. Various other embodiments are feasible consistent with the spirit and scope of the invention. In particular, materials other than those mentioned may be used. For example, other conductors such as iridium, tantalum, ruthenium, ruthenium oxide, copper, and aluminum might be used for the capacitor layers.

What is claimed is:

1. A memory cell for use in a dynamic random access memory comprising:
   a silicon chip comprising an active area of a first conductive type and spaced regions of a second conductive type on a top surface of the silicon chip;
   a dielectric coating over the top surface of the silicon chip, comprising an essentially cup-shaped contact hole, the cup-shaped contact hole including a bottom plug portion making a low resistance connection to one of the spaced regions;
   a conformal lower conductive layer overlying the cup-shaped walls of the contact hole;
   an intermediate dielectric layer overlying the conformal lower conductive layer and extending over the dielectric coating; and
   an upper conductive layer overlying the intermediate dielectric layer, the lower and upper conductive layers being electrically isolated by the intermediate dielectric layer and forming a storage capacitor for the memory cell.

2. The memory cell of claim 1, further comprising a diffusion barrier conductive layer overlying the cup-shaped walls of the contact hole and being between the lower conductive layer and the bottom plug portion.

3. The memory cell of claim 2, wherein the diffusion barrier conductive layer is one of TaSiN, TiN and TiAlN.

4. The memory cell of claim 1, wherein the bottom plug portion comprises doped polysilicon.

5. The memory cell of claim 1, wherein the intermediate dielectric layer comprises barium strontium titanate.

6. The memory cell of claim 2, wherein the lower and upper conductive layers comprises platinum.

* * * * *